United States Patent [19]
Sundaresan

[11] Patent Number: 5,298,782
[45] Date of Patent: Mar. 29, 1994

[54] STACKED CMOS SRAM CELL WITH POLYSILICON TRANSISTOR LOAD

[75] Inventor: Ravishankar Sundaresan, Garland, Tex.

[73] Assignee: SGS-Thomson Microelectronics, Inc., Carrollton, Tex.

[21] Appl. No.: 709,634

[22] Filed: Jun. 3, 1991

[51] Int. Cl.$^5$ .................. H01L 27/01; H01L 21/265
[52] U.S. Cl. ........................... 257/393; 257/67; 257/377; 257/382; 257/385; 257/388; 437/48; 437/49; 437/62; 437/191; 437/208; 437/915
[58] Field of Search ............... 357/23.7; 257/67, 377, 257/382, 385, 388, 393; 437/48, 49, 62, 191, 208, 915

[56] References Cited

U.S. PATENT DOCUMENTS

| | | | |
|---|---|---|---|
| 4,502,202 | 3/1985 | Malhi | 29/571 |
| 4,710,897 | 12/1987 | Masuoka et al. | 365/182 |
| 4,777,147 | 10/1988 | Scott et al. | 437/57 |
| 4,814,850 | 3/1989 | Malhi | 357/42 |
| 4,890,148 | 12/1989 | Ikeda et al. | 357/45 |
| 4,950,619 | 8/1990 | Yoon et al. | 437/47 |
| 5,057,898 | 10/1991 | Adan et al. | 357/23.7 |

FOREIGN PATENT DOCUMENTS

0181760 11/1985 European Pat. Off. .
0392540 4/1990 European Pat. Off. .

Primary Examiner—Edward Wojciechowicz
Attorney, Agent, or Firm—Anderson: Rodney M.; Lisa K. Jorgenson; Richard K. Robinson

[57] ABSTRACT

A CMOS SRAM memory cell, and a method of making the same, is disclosed. The disclosed cell is configured as cross-coupled CMOS inverters, with the n-channel pull-down transistors in bulk, and with the p-channel load devices being accumulation mode p-channel transistors in a thin polysilicon film. The cross-coupling connection is made by way of an intermediate layer, which may include polysilicon at its top surface for performance enhancement, each of which makes contact to the drain region of an n-channel transistor, and to the opposite gate electrode, via a buried contact. The intermediate layer also serves as the gate for the thin-film p-channel transistor, which has its channel region overlying the intermediate layer. The p-channel transistors may be formed so as to overlie part of the n-channel transistor in its inverter, thus reducing active chip area required for implementation of the memory cell.

20 Claims, 6 Drawing Sheets

STACKED CMOS SRAM CELL WITH POLYSILICON TRANSISTOR LOAD

This invention is in the field of integrated circuits, and is more specifically directed to static random access memory cells.

BACKGROUND OF THE INVENTION

Static random access memory (SRAM) integrated circuits are a popular type of computer memory devices, and have become even more popular in recent years with the advent of high speed and high density complementary metal-oxide-semiconductor (CMOS) technology. Conventional SRAM memory cells are commonly configured as a latch of cross-coupled inverters, each inverter usually having an n-channel drive transistor with either a resistive or active load. SRAM cells using resistor loads are commonly referred to as 4-T, 2-R cells (corresponding to four transistors and two resistors in each cell, including the bit line transfer devices). It is well known that the standby power of SRAM cells decreases with increasing load resistance, as the DC current drawn through the inverter having its n-channel pull-down transistor on will depend on this resistance. It is well known that the use of a p-channel transistor as an active load in a CMOS SRAM cell can provide extremely low standby current, as the p-channel transistor in a CMOS inverter is turned off (and is thus extremely resistive) when the n-channel device is on. Accordingly, where CMOS technology is available, use of a p-channel MOS transistor as the load can provide extremely low standby currents. SRAM cells which utilize p-channel load devices are commonly referred to as six-transistor, or 6-T, cells.

However, many CMOS SRAMs are manufactured having resistors as load devices, despite the availability of p-channel transistors elsewhere in the circuit. This is primarily due to the additional chip area required to include both n-channel and p-channel transistors in each memory cell. Formation of both an n-channel and a p-channel transistor in the single crystal semiconductor (substrate or epitaxial layer) requires not only active regions of both n-type and p-type, but also the provision of isolation regions therebetween. Isolation is particularly critical for SRAM cells, due to the stringent standby current specifications (making junction leakage intolerable), and to the need to avoid latchup conditions. As a result, more chip area is required for implementing a 6-T CMOS SRAM cell, including both types of active regions and the isolation therebetween for each memory cell, relative to the chip area required for a 4-T, 2-R SRAM cell. This has caused many manufacturers to implement resistor loads in the memory cells of their CMOS SRAMs.

Prior work has been directed to reducing the area required for CMOS inverters, or CMOS half-latches as useful in SRAM cells, by way of thin-film transistors. So-called "stacked" CMOS inverters which include an n-channel transistor in single crystal silicon, and a p-channel transistor in a polysilicon layer (or recrystallized polysilicon) thereover, with a common gate electrode therebetween, are described in U.S. Pat. No. 4,502,202 and U.S. Pat. No. 4,814,850, and in Malhi, et al., "A VLSI Suitable 2-μm Stacked CMOS Process", *Device Research Conference*, Paper VB.1 (IEEE, 1984). In addition, Malhi, et al., "Characteristics and Three-Dimensional Integration of MOSFET's in Small-Grain LPCVD Polycrystalline Silicon," *IEEE Transactions on Electron Devices*, Vol. ED-32, No. 2 (Feb. 1985), pp. 258–281 describes, particularly at pages 273 through 277, an implementation of an 6-T SRAM cell including stacked CMOS inverters.

By way of further background, U.S. Pat. No. 4,777,147 discloses a CMOS inverter which includes a self-aligned polysilicon n-channel driver transistor formed into a single crystal substrate. A polysilicon layer (annealed to single crystal at locations overlying the substrate) electrically connects to the drain of the n-channel transistor, and extends over isolation oxide, with source and drain regions doped thereinto in a self-aligned manner on either side of an overlying gate electrode, so as to form a thinfilm transistor over the isolation oxide which is connected to the n-channel drive transistor.

By way of still further background, U.S. Pat. No. 4,890,148 discloses an SRAM cell which uses gated thin film resistors as load devices. According to this disclosed SRAM cell, polysilicon resistors are provided which are separated from polysilicon/silicide gate electrodes by a relative thin insulating layer; the polysilicon resistors are also doped on one end with n-type dopant. The configuration of the SRAM cell is such that the gate of one of the n-channel drive transistors serves as the gate of the opposite load device, so that a high voltage thereon will turn on (i.e., cause conduction) through one n-channel drive transistor and through the opposite gated resistor.

It is an object of this invention to provide a six-transistor CMOS SRAM cell which requires a relatively small amount of chip area.

It is a further object of this invention to provide such an SRAM cell which utilizes thin-film transistors.

It is a further object of this invention to provide such an SRAM cell which utilizes complementary polysilicon load devices for each half latch.

Other objects and advantages will be apparent to those of ordinary skill in the art having reference to the following specification together with the drawings.

SUMMARY OF THE INVENTION

The invention may be incorporated into a CMOS SRAM memory cell of the six-transistor type which provides only the n-channel drive transistors in bulk. P-channel load devices are formed in a thin polysilicon film which overlies an intermediate conductive layer. This conductive layer contacts the drain of one n-channel drive transistor and the gate of the other n-channel drive transistor. A portion of this intermediate polysilicon layer also serves as the gate of the overlying p-channel accumulation mode transistor, as well as the cross-coupling interconnection.

DETAILED DESCRIPTION OF THE PREFERRED EMBODIMENT

Figure 1:
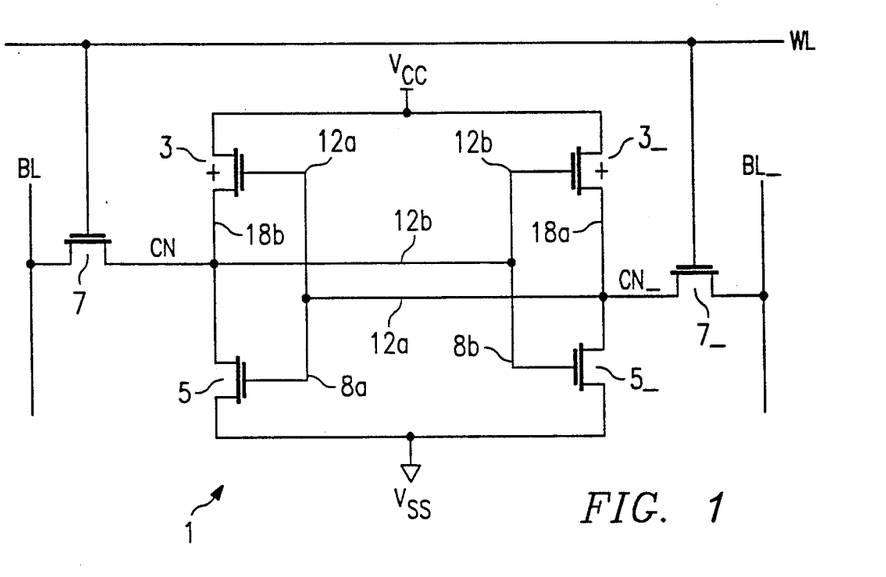
FIG. 1 is an electrical diagram, in schematic form, of a six-transistor CMOS SRAM cell.

FIG. 1 illustrates, in electrical schematic form, a conventional six-transistor CMOS SRAM cell 1 as will be constructed according to the preferred embodiment of the present invention. Cell 1 includes two pass gate transistors 7 and 7_ which have their source/drain paths connected in series between cell nodes CN and CN_, on the one hand, and bit lines BL and BL_, respectively, on the other hand Each of transistors 7 and 7_ are gated by word line WL which, in the conventional manner, is energized upon selection of its associated row of memory cells to couple the cell nodes CN and CN_ of each memory cell 1 in its row to the respective bit lines BL and BL_.

Memory cell 1 includes, in the conventional manner, cross-coupled inverters. A first inverter consists of p-channel transistor 3 and n-channel transistor 5, having their source/drain paths connected in series between power supply node $V_{cc}$ and reference node $V_{ss}$, and having their gates connected in common. Cell node CN is located at the common drain nodes of transistors 3 and 5. Similarly, the second inverter has p-channel transistor 3_ and n-channel transistor 5_ with their source/drain paths in series and their gates connected in common; cell node CN_ is at the common drain node of transistors 3_ and 5_. According to the conventional six-transistor CMOS SRAM cell arrangement, cross-coupling between the two inverters is accomplished by the connection of the gates of transistors 3 and 5 to cell node CN_, and the gates of transistors 3_ and 5_ to cell node CN. This configuration of the cross-coupled inverters is as a conventional CMOS latch. With word line WL inactive, the latch will retain a stored data state. Activation of word line WL to turn on pass transistors 7 and 7_ will place the latch in communication with bit lines BL and BL_ for output of the data state stored at cell nodes CN, CN_ in a read cycle, and their receipt of a new data state in a write operation.

Figure 2A:
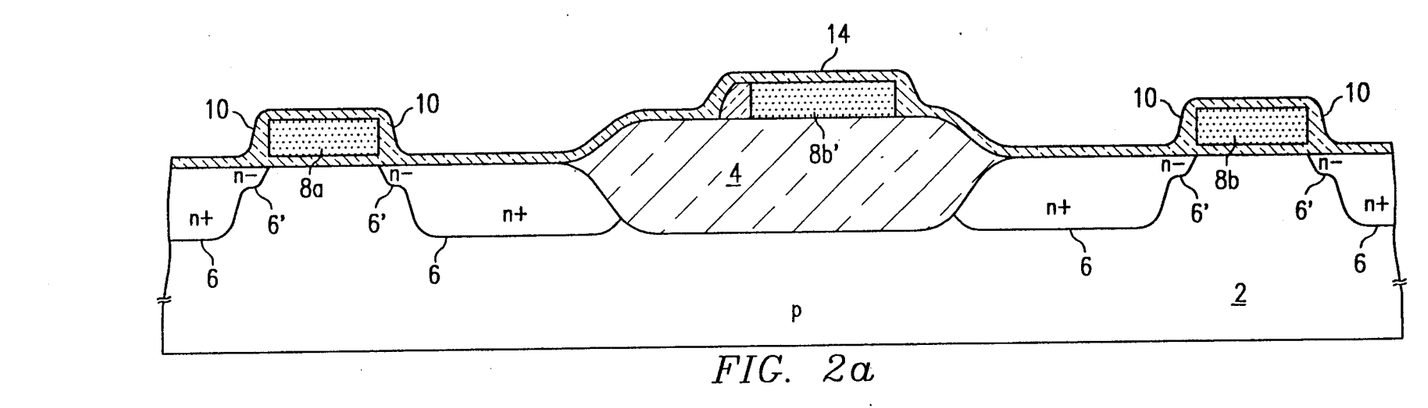
FIGS. 2a through 2d are cross-sectional views of the memory cell according to the preferred embodiment of the invention at various stages of its fabrication.
Figure 3A:
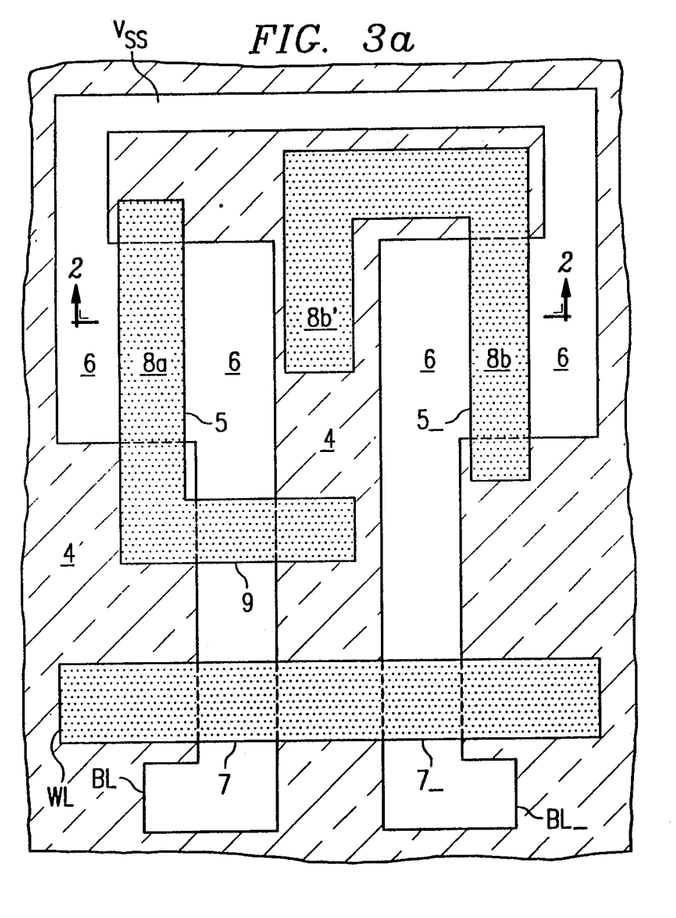
FIGS. 3a through 3e are plan views of the memory cell according to the preferred embodiment of the invention at various stages of its fabrication.

Referring now to FIGS. 2a and 3a in combination, the construction of memory cell 1 according to this embodiment of the invention will now be described in detail. At this point in the process, transistors 5 and 5_ have had their source/drain regions and gates formed in the conventional manner for n-channel transistors. It is preferred that transistors 5 and 5_ be formed according to the well-known lightly doped drain (LDD) technique, to reduce deleterious effects such as the so-called "hot" electron effect.

According to the preferred LDD technique for forming transistors 5 and 5_, active regions 6 are first defined by the formation of field oxide structures 4 at selected portions of the surface of the wafer. In this embodiment of the invention, a lightly doped p-type layer 2 serves as the bulk substrate; as is well-known, layer 2 may be the substrate itself, an epitaxial layer formed at the surface of a substrate, or a well formed into a substrate or epitaxial layer. Conventional LOCOS processing is suitable for forming field oxide structures 4, but of course other isolation techniques may alternatively be used. According to this sub-micron example of the invention, the minimum width of field oxide structures 4 is on the order of 0.8 μm, with the minimum width of active regions 6 being on the order of 0.6 μm. As will be noted hereinbelow, the overall size of memory cell 2 according to this example will be on the order of 21.5 μm².

Gate electrodes 8a and 8b of transistors 3 and 3_, respectively, are formed of a first layer of polycrystalline silicon, heavily doped n-type so as to be quite conductive, and which is patterned by way of conventional photolithography to define the gate electrodes thereof over active regions 6. In this example, the minimum width of gate electrodes 8a and 8b may be less than one micron, for example 0.5 μm. According to the preferred LDD construction of the source/drain regions, lightly doped source/drain extensions 6' extend under sidewall spacers 10 formed on the sides of gate electrodes 8a and 8b, as formed in a self-aligned manner relative thereto. Heavily doped source/drain regions are then formed into active regions 6 in a self-aligned manner relative to gate electrodes 8 and sidewall spacers 10 in the conventional manner, thus forming self-aligned transistors 5, 5_, 7 and 7_ shown in FIG. 3a. In memory cell 1, as shown in FIG. 3a, the portion of active regions 6 which is common to both transistors 5 and 5_ is connected to reference potential $V_{ss}$; this portion of active regions 6 can be shared by multiple memory cells 1 in the array.

As shown in FIGS. 2a and 3a, an extension 8b' of gate electrode 8b overlies a field oxide structure and is disposed between the active regions 6 of transistors 5 and 5_. Extension 8b' will be used in the interconnection of the cross-coupled inverters, as will be described hereinbelow. It should also be noted that a portion of gate electrode 8a overlies a second portion of an active region 6, at location 9 shown in FIG. 3a. According to this example, where minimum conductive layers are used, portion 9 of active region 6 should not be the channel region of a transistor but should remain conductive regardless of the voltage applied to the portion of gate electrode 8a thereover. This is due to the function of portion 9 as a connection between transistor 5 and transistor 7 (i.e., at cell node CN of FIG. 1). Accordingly, a relatively heavy n-type implant is preferably applied to portion 9 of active region 6 prior to the formation of gate electrode 8a thereover. Alternatively, use of an additional layer of interconnection, either metal or polysilicon, would avoid such a buried connection at portion 9; in such a case, however, the cell layout would likely be changed from that described herein in order to take advantage of the additional conductor layer, and for other reasons.

It should be noted that other materials may alternatively be used for gate electrodes 8, including refractory metals, metal silicides, or combinations thereof with polysilicon. It should also be noted that the silicide cladding of the source/drain regions of the transistors (i.e., the exposed portions of active regions 6) is also preferred for high performance circuits, particularly considering the sub-micron geometries of this example. Such cladding is preferably done by way of the well-known self-aligned direct react silicidation of a refractory metal, such as cobalt, platinum, or titanium, with silicon with which it is in contact.

Figure 2B:
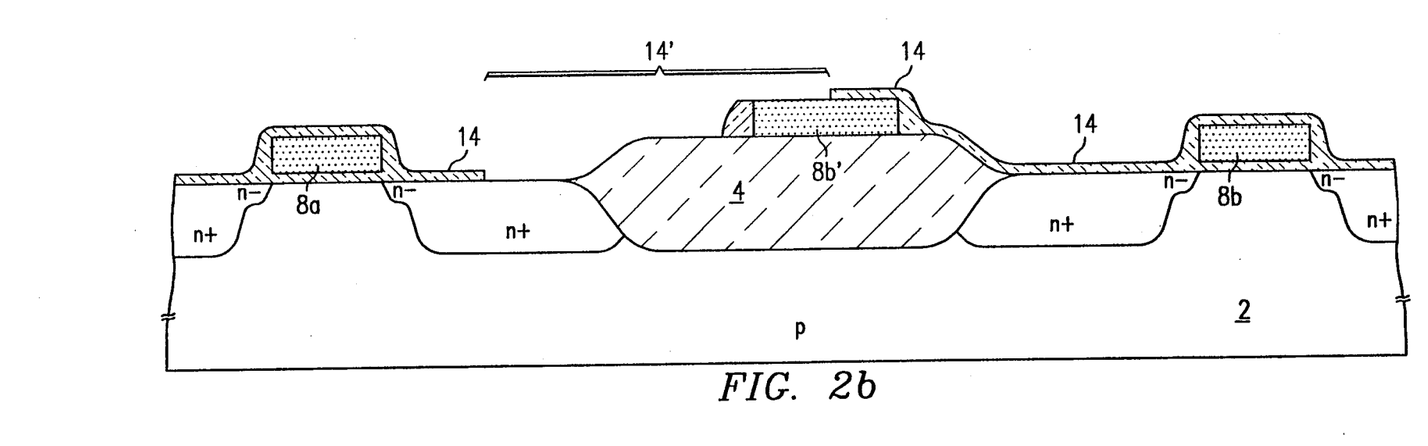
Figure 3B:
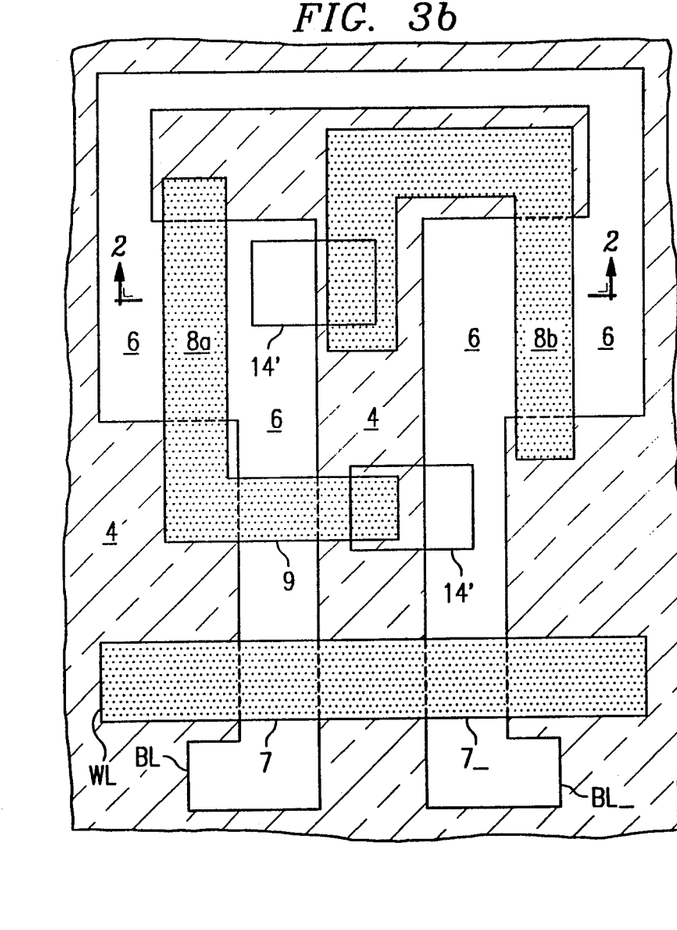

Also at the stage shown in FIG. 2a, a thin insulating layer 14, preferably a deposited oxide, having a thickness on the order of 150 nm, overlies gate electrodes 8a, 8b to electrically isolate them from the next conductor layer placed thereover. Referring now to FIGS. 2b and 3b, the structure is shown after the opening of contacts 14' through insulating layer 14. Contacts 14' allow for the connection of source/drain regions and gate electrodes 8 to one another. Accordingly, as shown in FIG. 3b, two contacts 14' are provided, one for each cross-coupling path between the drain of a transistor 5, 5_ and gate electrode 8b, 8a, respectively, of the opposite transistor 5_, 5. The photolithographic patterning and etching of contacts 14' may be performed according to conventional techniques.

Figure 2C:
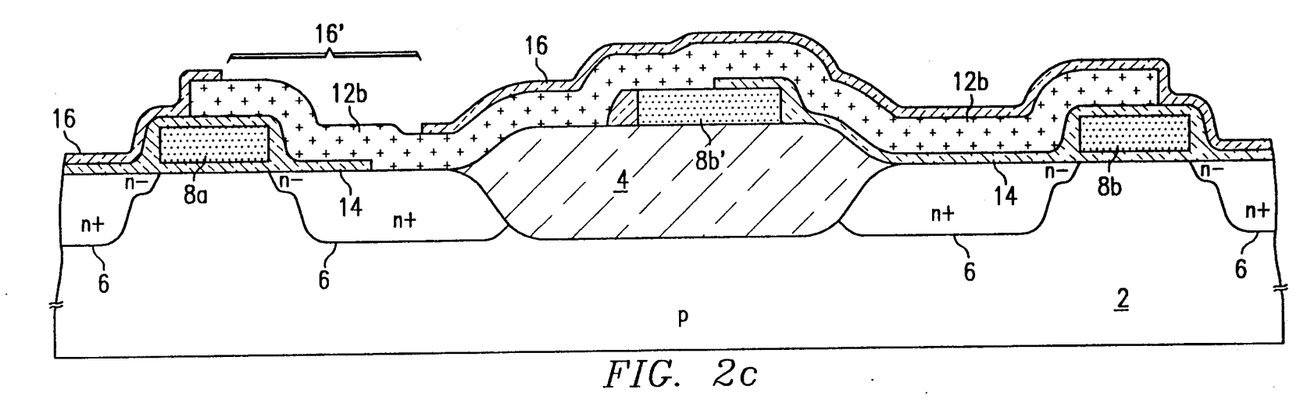
Figure 3C:
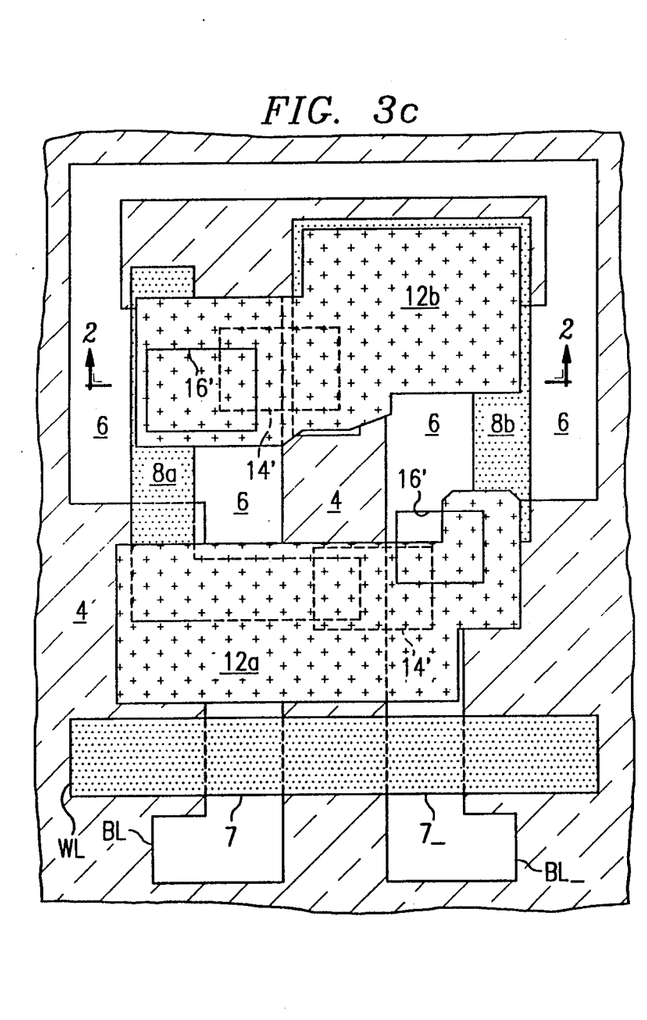

Referring now to FIGS. 2c and 3c, the structure is shown after the formation of intermediate layer 12. Intermediate layer 12 is preferably a film of CVD polysilicon, deposited after the opening of contacts 14' through insulating layer 14. The thickness of intermediate layer 12 is preferably on the order of 150 nm to 250 nm. Intermediate polysilicon layer 12 is preferably quite heavily doped, either after its deposition in the conventional manner, or in-situ with its deposition, to provide conductive connection between the gates and drains of transistors 5 and 5' via contacts 14'. In addition, intermediate layer 12 also serves as the gate electrode for the overlying load devices in the SRAM cell 1 according to the present invention, as will be described below.

As in the case of polysilicon layer 8, it should be noted that other materials, such as titanium nitride, refractory metals, metal silicides, and combinations thereof with polysilicon, can be used as the material for intermediate layer 12. In order for best transistor characteristics, however, if a combination of polysilicon and another material such as a silicide is used, it is strongly preferred that the polysilicon be the upper layer, as the transistor channel will be above intermediate layer 12. In addition, in the alternative to silicon dioxide for layer 14, other dielectric materials, such as silicon nitride, metal oxides, or multilayer films, may be used.

By way of conventional photolithography and etching, selected portions of intermediate layer 12 are removed to define the shape of the connections and gate electrodes. As shown in FIG. 2c, intermediate electrode 12b is in contact with a drain region 6 of transistor 5 and with gate electrode extension 8b' of transistor 5_ via contact opening 14'. The other intermediate electrode 12a makes contact between the drain of transistor 5 and gate electrode 8a through another contact 14', as shown in FIG. 3c.

Also as shown in FIG. 3c, intermediate electrodes 12a and 12b preferably overlap portions of transistors 5 and 5_, in order to minimize the layout area required for cell but are electrically insulated from the other active elements by insulating layer 14. Since insulating layer 14 is relatively thin, as noted hereinabove, this construction will add a certain amount of capacitive coupling between each intermediate electrode 12 and its opposing cross-coupled cell node. For example, intermediate electrode 12b is connected to cell node CN at the drain of transistor 5 and the gate of transistor 5_ (see FIG. 1), and overlaps the gate electrode 8a and the drain of transistor 5_. This overlap presents a capacitance between cell node CN and cell node CN_. Intermediate electrode 12a similarly adds capacitance between cell node CN and cell node CN_. While such capacitance is somewhat undesirable as it adds to the capacitive load of the cell as seen by the write circuitry, this capacitance between the cross-coupled cell nodes CN and CN_ improves the stability of the memory cell, making it more difficult for noise, an alpha particle, or another event to upset the data state stored in memory cell 1. It is contemplated that the write circuitry of the memory device can be enlarged to provide the extra write signal needed to overcome this added capacitance.

Also as shown in FIG. 2c, a thin dielectric layer 16 is deposited upon, or thermally grown from, intermediate layer 12, for eventual use as the gate dielectric for the load transistors 3, 3_ of memory cell 1. The preferred material for layer 16 is a multilayer film of silicon dioxide of on the order of 15 nm thick, underlying a film of silicon nitride on the order of 10 to 20 nm thick. Of course, other dielectric materials such as metal oxides, or single layers of oxide or nitride, may alternatively be used. After formation of dielectric layer 16, contacts 16' are opened therethrough by way of conventional photolithography and etching at those locations, shown in FIGS. 2c and 3c, where electrical connection between intermediate layer 12 and the overlying thin film transistor is to be made, as will be apparent from the description hereinbelow.

Figure 2D:
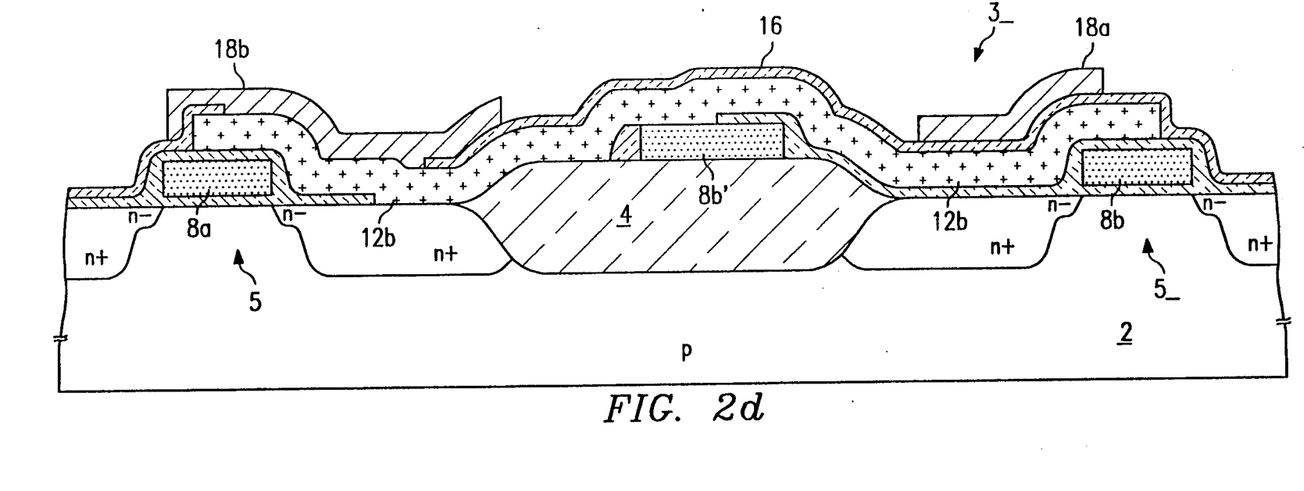
Figure 3D:
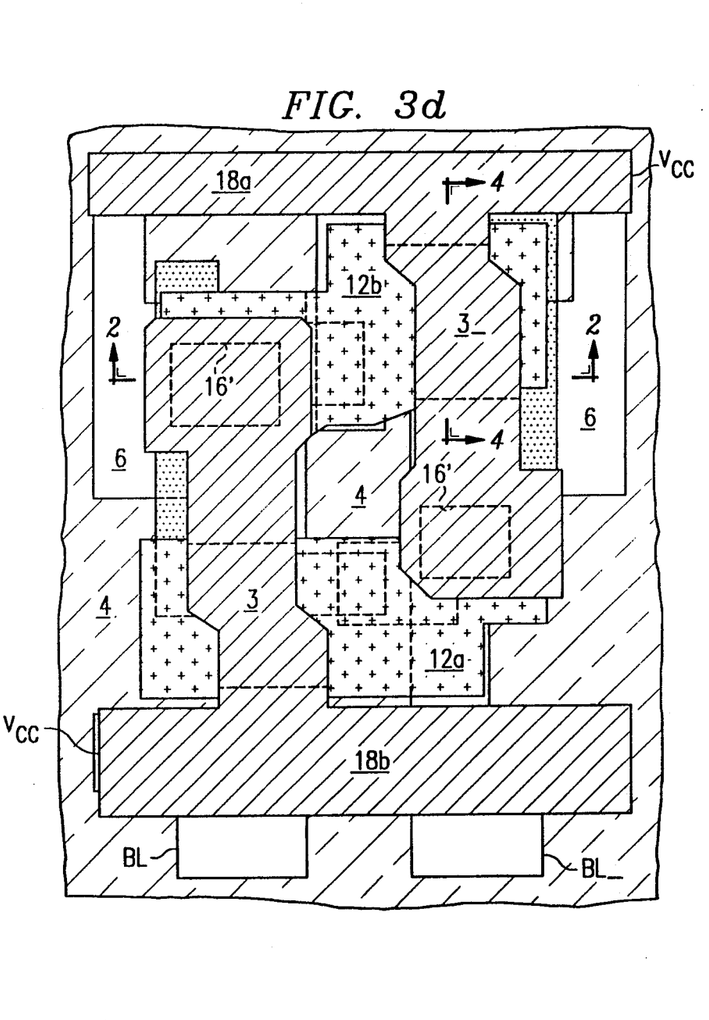
Figure 4:
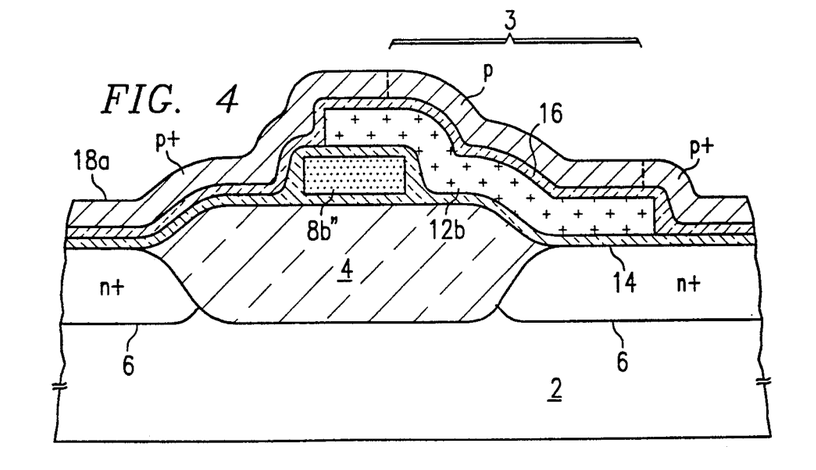
FIG. 4 is a cross-sectional view of the structure of FIG. 3d, taken in a direction perpendicular to that of FIG. 2d.

Referring now to FIGS. 2d, 3d and 4, the structure is shown after the deposition and patterning of active polysilicon layer 18, into which will be formed the source, drain and channel region of the load devices of memory cell 1. Polysilicon layer 18 is deposited in the conventional manner, for example by CVD, to a thickness on the order of 50 to 150 nm, and is also preferably deposited as undoped. As shown particularly in FIG. 2d, polysilicon layer 18 makes contact with intermediate layer 12 at the locations of contacts 16', and is separated therefrom by dielectric layer 16 elsewhere.

Referring particularly to FIGS. 3d and 4, the construction of p-channel load transistors 3 will now be described. The portions of polysilicon layer 18 which will serve as the source and drain regions of transistors 3 and 3_ are heavily doped p-type, by way of ion implantation or decomposition of a boron-bearing gas, in the conventional manner. During such doping, however, a portion of polysilicon layer 18 which overlies both dielectric layer 16 and intermediate layer 12 is masked from this doping step. This masked portion of polysilicon layer 18 serves as the channel region of transistors 3 and 3_, as shown in FIG. 3d. It should be noted that the boundaries of the channel regions of the transistors are preferably within intermediate layer 12 thereunder, to ensure that the transistors will turn on, while accounting for some amount of misalignment tolerance.

According to this embodiment of the invention, it is preferred that transistors 3 and 3_ operate in the accumulation mode, as this provides for a relatively low threshold voltage and relatively high drive current. Accordingly, a light p-type implant of the channel regions of transistors 3 and 3_, after removal of the masking layer thereover, is preferably done. An example of the preferred impurity concentration in the channel regions of transistors 3 and 3_, for polysilicon layer 18 having a thickness of 80 nm, is on the order of $8 \times 10^{16}$ cm$^{-3}$. Alternatively, transistors 3 and 3_ may be constructed to operate in the inversion mode, if desired for the particular circuit arrangement or manufacturing process.

In this embodiment of the invention, it should be noted that the two portions 18a and 18b of polysilicon layer 18 form the two load transistors 3 and 3_, so that cell 1 is fabricated using only three conductive layers (gate electrode layer 8, intermediate layer 12, and polysilicon layer 18); metal bit lines for communication of the data will be provided thereover, as will be noted hereinbelow. According to this construction, where the number of conductive layers is minimized, separate connection of power supply node $V_{cc}$ must be made to each of the two portions of polysilicon layer 18 (i.e., the sources of transistors 3 and 3_). Alternatively, use of an additional conductive layer over polysilicon layer 18 could allow for a single V$_{cc}$ connection to memory cell 1, thus allowing for a smaller layout area at the expense of processing complexity added by this additional conductive level and its contacts.

Each of the two portions 18a and 18b of polysilicon layer 18 make connection, via a contact 16', to a portion of intermediate layer 12 which is the gate of the other portion of polysilicon layer 18. For example, the drain end of polysilicon layer portion 18a in transistor 3_ makes connection to cell node CN_ at intermediate layer portion 12a, which also serves as the gate of transistor 3. Intermediate layer portion 12a also is connected to gate electrode 8a of transistor 5 and to the drain of transistor 5_, through contact 14'. Similarly, the drain end of polysilicon layer portion 18b (drain of transistor 3) is connected to intermediate layer portion 12b at cell node CN; intermediate layer portion 12b serves as the gate of transistor 3_, and is connected, via contact 14', to gate electrode extension 8b and to the drain of transistor 5. The cross-coupled configuration for cell 1 is thus accomplished in the manner illustrated electrically in FIG. 1.

Figure 3E:
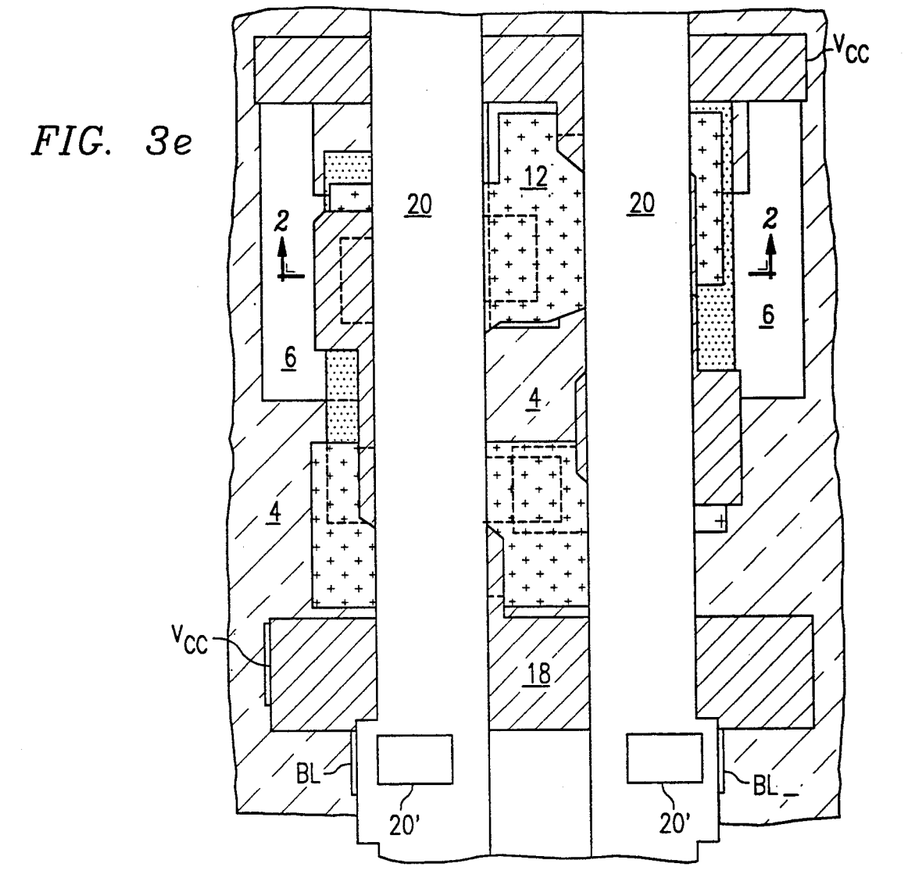

Referring now to FIG. 3e, cell 1 is shown after provision of metal bit lines BL and BL_ which contact one side of pass transistors 7. Metal bit lines BL and BL are of course insulated from polysilicon layer 18 and the other conductive layers by way of an interlevel dielectric such as deposited silicon dioxide, with contacts 20' made therethrough so that metal bit lines BL and BL_ are connected to pass transistors 7 and 7_, respectively. Metal bit lines BL and BL_ will, of course, make contact to each of the memory cells 1 in the common column, and as such extend in a direction perpendicular to that of word line WL. According to this construction of memory cell 1, power supply and reference lines V$_{cc}$ and V$_{ss}$ also run perpendicular to bit lines BL and BL_. The construction of cell according to this embodiment of the invention is thus completed.

As a result of the present invention, a full CMOS SRAM cell 1 is provided which is realized in extremely small chip area. The small chip area is obtained by the provision of the p-channel load transistors 3 and 3_ overlying the n-channel pull-down transistors 5 and 5_ of the same inverter. It is contemplated that this construction will provide extremely low standby currents, with good data retention characteristics and stability to upset events. The cell can be fabricated using currently available processing equipment.

While the invention has been described herein relative to its preferred embodiment, it is of course contemplated that modifications of, and alternatives to, this embodiment, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

I claim:

1. A complementary metal-oxide-semiconductor memory cell formed at a semiconductor surface of a body, comprising:
    first and second drive transistors, each having source and drain regions formed into said semiconducting surface, and each having a gate electrode overlying said semiconducting surface, said first and second drive transistors being of a first conductivity type;
    a first intermediate layer electrode in physical contact with the drain of said second drive transistor and with the gate electrode of said first drive transistor, said first intermediate layer electrode having a portion overlying a portion of said first drive transistor;
    a second intermediate layer electrode in physical contact with the drain of said first drive transistor and with the gate electrode of said second drive transistor, said second intermediate layer electrode having a portion overlying a portion of said second drive transistor;
    a gate dielectric layer overlying portions of said first and second intermediate layer electrodes;
    a first load transistor of a second conductivity type formed of a layer comprising polysilicon, and disposed over the portion of said first intermediate layer electrode that overlies a portion of the first drive transistor, with said gate dielectric layer therebetween; and
    a second load transistor of said second conductivity formed of a layer comprising polysilicon, and disposed over a portion of said second intermediate layer electrode that overlies a portion of the second drive transistor, with said gate dielectric layer therebetween.

2. The memory cell of claim 1, wherein said first and second load transistor each comprise:
    doped source and drain regions; and
    a channel region, disposed between said source and drain regions, and having an impurity concentration less than sad doped source and drain regions;
    wherein said channel region of said first load transistor is disposed over said portion of said first intermediate layer electrode with said gate dielectric layer therebetween;
    and wherein said channel region of said second load transistor is disposed over said portion of said second intermediate layer electrode with said gate dielectric layer therebetween.

3. The memory cell of claim 2, wherein said drain region of said first load transistor is in physical contact with said second intermediate layer electrode;
    and wherein said drain region of said second load transistor is in physical contact with said first intermediate layer electrode.

4. The memory cell of claim 2, wherein said first load transistor extends over a portion of said first drive transistor;
    and wherein said second load transistor extends over a portion of said second drive transistor.

5. The memory cell of claim 2, wherein said first conductivity type is n-type and said second conductivity type is p-type.

6. The memory cell of claim 5, wherein said channel regions of said first and second load transistors are doped p-type, so that said first and second load transistors are accumulation mode.

7. The memory cell of claim 1, further comprising:
    first and second bit lines for communicating a differential signal to and from said memory cell;
    first and second pass transistors, having their source/drain paths connected between the drain of said first and second drive transistors, respectively, and said first and second bit lines, respectively, and each having a gate controlled by a word line.

8. The memory cell of claim 1, further comprising:
    a second dielectric layer;

and wherein said first intermediate layer electrode overlies a portion of the drain of said first drive transistor, insulated therefrom by said second dielectric layer;

and wherein said second intermediate layer electrode overlies a portion of the drain of said second drive transistor, insulated therefrom by said second dielectric layer.

9. The memory of cell of claim 1, wherein said first intermediate layer electrode is in physical contact with the drain of said second drive transistor via a contact opening through said second dielectric layer;

and wherein said second intermediate layer electrode is in physical contact with the drain of said first drive transistor via a contact opening through said second dielectric layer.

10. The memory cell of claim 1, wherein said first and second intermediate layer electrodes each comprise polysilicon.

11. The memory cell of claim 10, wherein the upper surface of said first and second intermediate layer electrodes each comprise polysilicon.

12. The memory cell of claim 11, wherein the lower surfaces of said first and second intermediate layer electrodes each comprise a metal silicide.

13. A method of fabricating a CMOS memory cell at a semiconducting surface of a body, comprising the steps of:

forming first and second bulk source regions and first and second bulk drain regions, each doped with impurities of a first conductivity type, into selected locations of said surface, said first bulk source region separated from said first bulk drain region by a first bulk channel region, and said second bulk source region separated from said second bulk drain region by a second bulk channel region;

forming first and second gate electrodes over said first and second bulk channel regions, respectively;

forming a first dielectric layer over said first and second gate electrodes, said first dielectric layer having contacts therethrough at selected locations to expose a selected portion of each of said first and second gate electrodes, and to expose a selected portion of each of said first and second bulk drain regions;

forming first and second portions of a conductive intermediate layer over said first dielectric layer, said first portion of said intermediate layer being in physical contact with the exposed portions of said first gate electrode and said second bulk drain region, and said second portion of said intermediate layer being in physical contact with the exposed portions of said second gate electrode and said first bulk drain region;

forming a second dielectric layer over said first and second intermediate layer portions, said second dielectric layer having contact openings therethrough to expose portions of said first and second intermediate layer portions; and forming an active layer, comprising polysilicon, over said second dielectric layer, said active layer having a first portion in physical contact with said first intermediate layer portion via one of said contact openings through said second dielectric layer, and having a second portion in physical contact with said second intermediate layer portion via one of said contact openings through said second dielectric layer; and doping source and drain regions of said first and second active layer portions with impurities of a second conductivity type, said source and drain regions of said first and second active layer portions each separated by a channel region therein, said channel region of said first active layer portion overlying said first intermediate layer portion and separated therefrom by said second dielectric layer and said drain region of said first active layer portion including the portion in contact with said second intermediate layer portion, and said channel region of said second active layer portion overlying said second intermediate layer portion and separated therefrom by said second dielectric layer and said drain region of said second active layer portion including the portion in contact with said first intermediate layer portion.

14. The method of claim 13, wherein said second conductivity type is p-type.

15. The method of claim 14, wherein said channel regions of said first and second active layer portions are lightly doped p-type, so that said first and second active layer portions, together with the underlying second and first intermediate layer portions, respectively, form accumulation mode p-channel transistors.

16. The method of claim 13, wherein said first and second active layer portions each overlie a portion of said second and first bulk drain regions, respectively.

17. The method of claim 16, wherein each of said contact openings through said first dielectric layer expose portions of both of one of said bulk drain region and one of said gate electrodes.

18. The method of claim 13, wherein said intermediate layer comprises polysilicon.

19. The method of claim 18, wherein the top surface of said intermediate layer comprises polysilicon.

20. The method of claim 13, wherein said first and second bulk source and bulk drain regions are formed after said step of forming said first and second gate electrodes.

* * * * *

UNITED STATES PATENT AND TRADEMARK OFFICE
CERTIFICATE OF CORRECTION

PATENT NO. : 5,298,782
DATED : March 29, 1994
INVENTOR(S) : Sundaresan

It is certified that error appears in the above-identified patent and that said Letters Patent is hereby corrected as shown below:

In column 4, line 1, please change "transistors 3 and 3__" to --transistors 5 and 5__--.

Signed and Sealed this

Third Day of September, 1996

Attest:

BRUCE LEHMAN

Attesting Officer     Commissioner of Patents and Trademarks